United States Patent
Lee

(10) Patent No.: US 7,867,804 B2
(45) Date of Patent: Jan. 11, 2011

(54) SEMICONDUCTOR DEVICE AND METHOD FOR FABRICATING THE SAME

(75) Inventor: Byung-Ho Lee, Gwangmyeong-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 84 days.

(21) Appl. No.: 12/168,088

(22) Filed: Jul. 4, 2008

(65) Prior Publication Data

US 2009/0008636 A1     Jan. 8, 2009

(30) Foreign Application Priority Data

Jul. 4, 2007    (KR) ............... 10-2007-0066923

(51) Int. Cl.
*H01L 21/06* (2006.01)
(52) U.S. Cl. .............. 438/54; 438/102; 438/132; 257/4; 257/E45.001; 257/E47.001
(58) Field of Classification Search .......... 438/54, 438/102, 132; 257/4, 42, 209, 359, 467, 257/530, E45.001, E47.001
See application file for complete search history.

(56) References Cited

U.S. PATENT DOCUMENTS

| | | | |
|---|---|---|---|
| 6,583,490 B2 * | 6/2003 | Hagiwara et al. | 257/530 |
| 7,015,076 B1 * | 3/2006 | Chan et al. | 438/131 |
| 2005/0184282 A1 | 8/2005 | Lai | |
| 2006/0113520 A1 | 6/2006 | Yamamoto | |
| 2007/0108433 A1 * | 5/2007 | Lee et al. | 257/4 |
| 2007/0158690 A1 * | 7/2007 | Ho et al. | 257/209 |
| 2007/0189053 A1 * | 8/2007 | Pellizzer et al. | 365/96 |
| 2008/0029786 A1 * | 2/2008 | Fan | 257/209 |

FOREIGN PATENT DOCUMENTS

JP    2008-147590    6/2008

* cited by examiner

*Primary Examiner*—Mary Wilczewski
*Assistant Examiner*—Toniae M Thomas
(74) *Attorney, Agent, or Firm*—Sherr & Vaughn, PLLC

(57) ABSTRACT

A semiconductor device that includes a phase change material for protecting the device from failure caused by overheating. The semiconductor device is adapted to detect a rapid increase in current due to heat and also adapted to break a circuit in the detected rapid increase in current by depositing a phase change material inside or outside a cell actually operated in the semiconductor device.

16 Claims, 2 Drawing Sheets

SEMICONDUCTOR DEVICE AND METHOD FOR FABRICATING THE SAME

Figure 1:
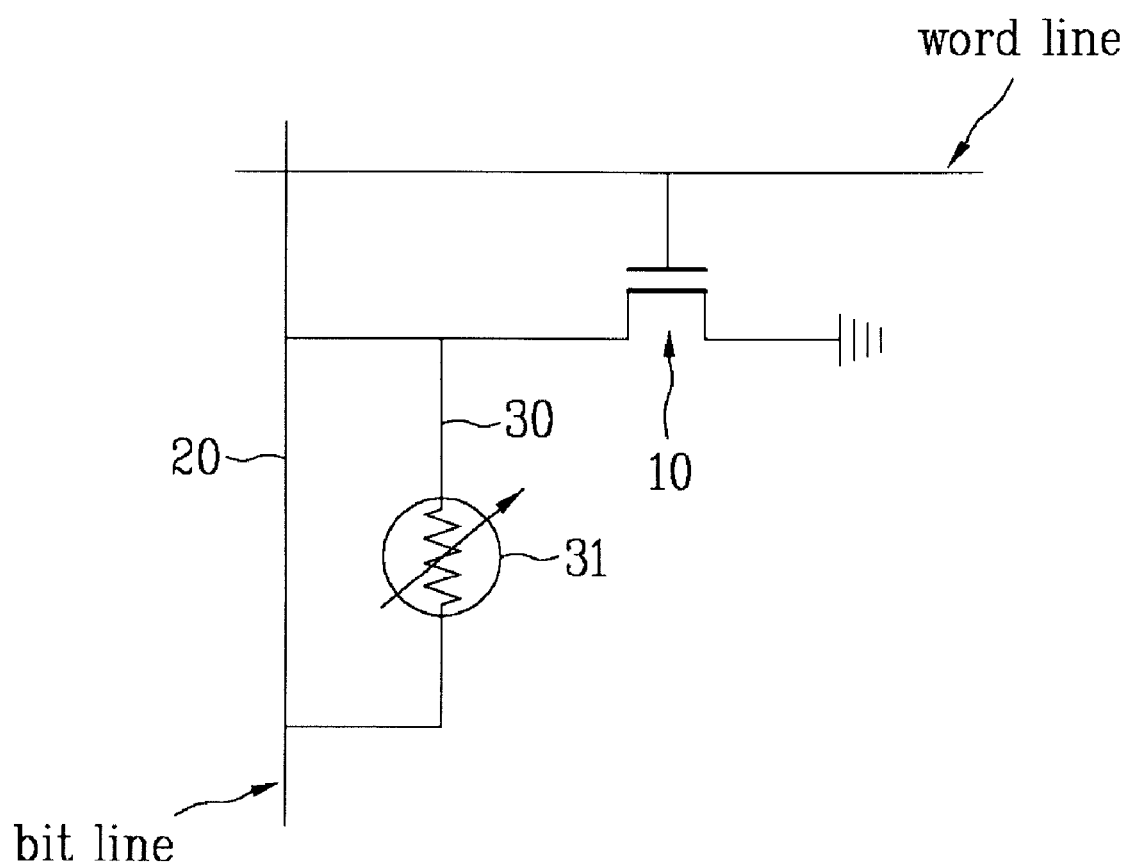

The present application claims priority under 35 U.S.C. §119 to Korean Patent Application No. 10-2007-0066923 (filed on Jul. 4, 2007), which is hereby incorporated by reference in its entirety.

BACKGROUND

Due to the requirement of achieving high integration, semiconductor devices may be structured having small sizes. Due to this requirement, however, device defects caused by the generation of heat is may result. For instance, problems such as a metal short circuit or formation of a cavity are caused by heat generated due to current/voltage applied in operation of the semiconductor device. Since a device function is completely lost and restoration is impossible due to such problems, quality inspection should be conducted whenever the semiconductor device is fabricated. However, since a structural design of various metal materials or a material is required to be altered in order to undergo quality inspection in fabrication of the semiconductor device, many human and material resources are wasted. Even if so, quality inspection for inspecting electro migration (EM) characteristics or stress migration (SM) characteristics should be performed to realize a semiconductor device having good quality. Ultimately, it may be necessary to guarantee stability of the device against heat generated in the device.

SUMMARY

Embodiments relate to a semiconductor device and a method for fabricating the same that utilizes phase change material in order to protect the device.

Embodiments relate to a semiconductor device and a method for fabricating the same that is adapted to prevent a device defect and a device failure due to heat of the semiconductor device.

Embodiments relate to a semiconductor device and a method for fabricating the same that is adapted to detect a rapid increase in current due to heat and also adapted to break a circuit in the rapid increase in current by depositing a phase change material inside or outside a cell operated within the semiconductor device.

Embodiments relate to a method for fabricating a semiconductor device that can include at least one of the following steps: forming a transistor on and/or over a wafer; and then forming an insulating film on and/or over the transistor; and then forming a first contact hole and a second contact hole in the insulating film for electrical connection of a source/drain region of one side among source/drain regions formed at opposite sides of the transistor; and then forming a phase change material layer which selectively breaks electrical connection in accordance with a temperature variation by depositing a phase change material in the second contact hole; and then burying a conductive material in the first contact hole and the second contact hole.

Embodiments relate to a semiconductor device that can include at least one of the following: a transistor; a first electrode line connected to a gate of the transistor; a second electrode line connected to a drain of the transistor; and first and second contact plugs which connect the second electrode line with the drain in parallel to each other; and a circuit breaker formed on the second contact plug, the circuit breaker adapted to break the electrical connection between the second electrode line and the drain according temperature variation.

Embodiments relate to a semiconductor device that can include at least one of the following: a transistor formed on and/or over a wafer; an insulating film formed on and/or over the transistor; a first contact hole and a second contact hole formed in the insulating film to be adjacent to each other at an upper portion of a source/drain region of one side among source/drain regions formed at opposite sides of the transistor; an upper electrode formed at an upper portion of each of the contact holes to be electrically connected to the source/drain region of one side; and a phase change material layer formed in the second contact hole to selectively break electrical connection through the second contact hole according to a temperature.

DRAWINGS

Example FIG. 1 illustrates an equivalent circuit of a unit cell in a semiconductor device in accordance with embodiments.

Figure 2:
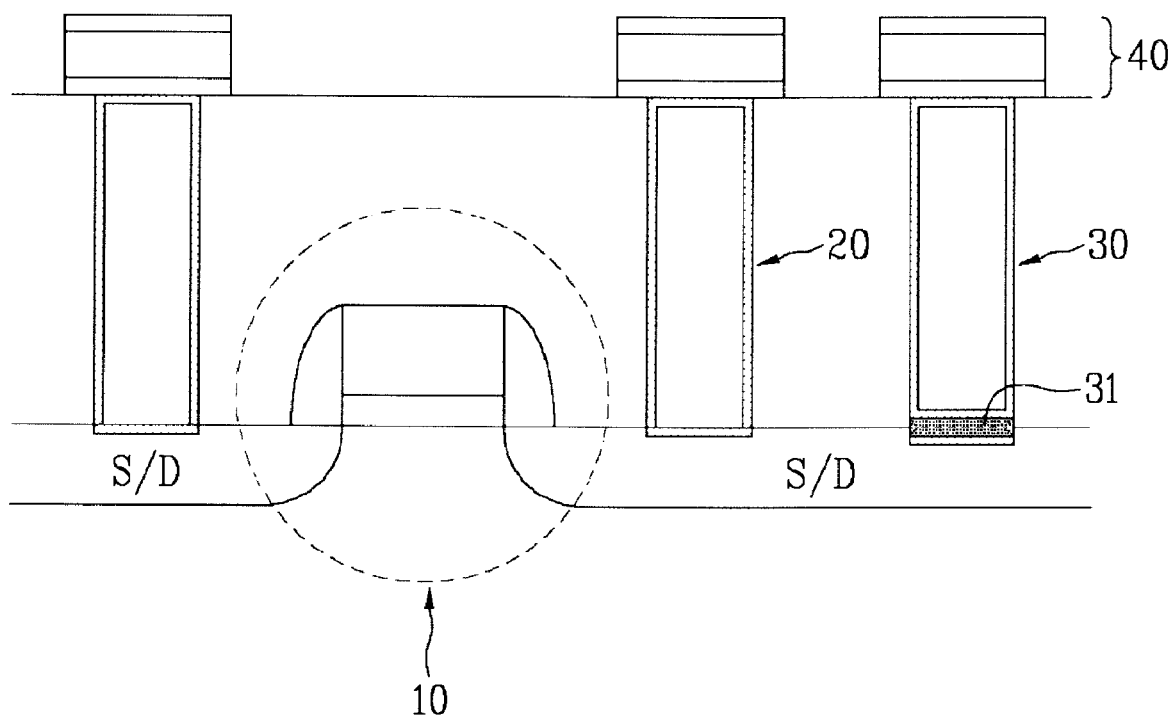

Example FIG. 2 illustrates a semiconductor device in accordance with embodiments.

DESCRIPTION

Reference will now be made in detail to the embodiments, examples of which are illustrated in the accompanying drawings. Wherever possible, the same reference numbers will be used throughout the drawings to refer to the same or like parts. The configuration and the effect of embodiments are described with reference to the accompanying drawings. The configuration and the effect of embodiments illustrated in the drawings and described herein are explained as at least one example, and the technical idea, essential configuration and effect of such embodiments are not limited thereto.

As illustrated in example FIG. 1, the unit cell of the semiconductor device in accordance with embodiments may have a structure in which one transistor 10 is connected to two electrode lines. Although the two electrode lines may include a word line and a bit line as illustrated herein, it is not limited thereto. The electrode lines may be formed of at least one of Al and Cu. The word line may be electrically connected to a gate of transistor 10 and the bit line may be electrically connected to a drain or source of transistor 10. As illustrated in example FIG. 1, the drain may be connected to the bit line. The bit line and the drain may be electrically connected to each other in parallel. That is, first contact plug 20 may be provided for electrical connection between the bit line and the drain, and second contact plug 30 which is connected to the first contact plug 20 in parallel, may be further provided as another contact plug for electrical connection between the bit line and the drain.

The cell in accordance with embodiments may further include circuit breaker 31 disposed under second contact plug 30 to break the electrical connection between the bit line and the drain in accordance with a temperature variation of the device. Accordingly, circuit breaker 31 may be electrically connected to the bit line. Circuit breaker 31 in accordance with embodiments may be formed of one or more phase change materials. Embodiments may employ a phase change material which changes its phase in accordance with a variation in temperature (heat) to vary a self-resistance. Particularly, embodiments may employ a phase change material to break a circuit when the temperature increases due to heat. That is, the device is turned off upon a detection of a rapid increase in current due to heat. Of course, the phase change material changes a self resistance value when the temperature exceeds a predetermined critical value for a specific period of time to turn off the device. Further, when the temperature decreases below the critical value and is maintained for a specific period of time later, the state is restored to change the resistance value and turn on the device. The phase change material may be composed of a compound such as at least one of Ge—Sb—Te, Ge—Te, Sb—Te, an element of the fifth group-Sb—Te, an element of the sixth group-Sb—Te, which contains at least one of germanium (Ge), stibium (Sb) and tellurium (Te).

Accordingly, circuit breaker 31 may change a resistance value of the phase change material to break electrical connection between the bit line and the drain when the device is maintained at a temperature higher than a predetermined level. Such predetermined temperature level may represent a temperature exceeding a critical value for a specific period of time, thereby resulting in the device being place in an off operating mode. For example, the phase change material has an amorphous state in which resistivity is high when there is no heat in an initial period. Then, when the temperature gradually increases to about 150° C. as heat is generated, the resistance may be rapidly reduced. Accordingly, current flows into second contact plug 30 to break the circuit.

As described above, in accordance with embodiments, contact plug 30 having circuit breaker 31 formed of the phase change material may be further installed in parallel between the bit line and the drain, thereby preventing a device defect or failure caused by temperature variation due to heat. Meanwhile, circuit breaker 31 may further include a nitride-based heating material formed at an upper portion and a lower portion of the phase change material to cover or other enclose the phase change material. For example, a nitride material such as TiN may be used as the heating material. Further, for example, a material having resistivity increasing in proportion to the temperature may be used as the heating material. Further, a temperature T, at which the resistance rapidly decreases varies in accordance with the phase change material used in the circuit breaker 31 or a chemical composition ratio. Accordingly, in accordance with embodiments, the phase change material may be selected or a composition ratio of a compound containing at least one of germanium (Ge), stibium (Sb) and tellurium (Te) may be adjustable in order to set the temperature $T_c$ appropriate for the characteristics of the device.

As illustrated in example FIG. 2, the unit cell in accordance with embodiments may include transistor 10 formed on and/ or over a wafer. An insulating layer having a plurality of contact holes 20 and 30 may be disposed on and/or over transistor 10. Contact holes 20 and 30 may be formed in the insulating layer to electrically connect source/drain regions to metal electrodes 40 to be formed later at an upper portion of contact holes 20 and 30. The source/drain regions may be formed at opposite sides adjacent to the gate of transistor 10. First contact hole 20 and second contact hole 30 may be spaced apart in one source/drain region among the source/ drain regions formed at the opposite sides of the gate. Metal electrode 40 may be disposed on each contact hole 20 or 30 may be electrically connected to the source/drain region disposed under a lower portion of the corresponding contact hole 20 and 30.

Phase change material layer 31 may be formed in second contact hole 30. Phase change material layer 31 may change its state to selectively break electrical connection through second contact hole 30 as a result of a variation in a detected or sensed temperature. For instance, when the temperature is maintained to be equal to or higher than a predetermined level for a specific period of time, or when the temperature simply increases to be equal to or higher than a predetermined level, a resistance value of the phase change material is reduced and current flows through second contact hole 30, thereby breaking the circuit. However, when the temperature decreases again later, the resistance value of the phase change material increases to break current flowing through second contact hole 30. Accordingly, the circuit is turned on. Phase change material layer 31 may be formed of a phase change material such as a compound such as Ge—Sb—Te, Ge—Te, Sb—Te, an element of the fifth group-Sb—Te, an element of the sixth group-Sb—Te, which contains at least one of germanium (Ge), stibium (Sb) and tellurium (Te). In addition, nitride-based heating material layers may be formed at an upper portion and a lower portion of phase change material layer 31 to cover phase change material layer 31. Heating material layer may be formed of nitride such as TiN.

A procedure for fabricating the unit cell of the semiconductor device having the above configuration in accordance with embodiments is explained as follows. First, a transistor including source/drain regions, a device isolation film, a gate, a spacer and the like may be formed on and/or over a wafer. An insulating layer may then be formed on and/or over the transistor. The insulating layer may be formed, for example, by depositing an oxide material. A photoresist pattern may then be formed on and/o over the insulating layer. A plurality of contact holes may then be formed by removing a portion of the insulating layer using the photoresist pattern as a mask. The contact holes may be formed in the source/drain regions at the opposite sides of the transistor. Particularly, two contact holes spaced apart adjacent to each other may be formed on the same source/drain region. A phase change material which changes its state (resistance value) according to temperature variation is deposited in one of the two contact holes formed adjacent to each other in the source/drain region of one side. In addition, a heating material layer may be further formed at a lower portion and/or an upper portion of the phase change material. In this case, a lower heating material layer may be formed before the phase change material is deposited. After the phase change material is deposited on and/or over the lower heating material layer, an upper heating material layer may then be formed on and/or over the phase change material layer. The heating material layer may be formed of a nitride-based material containing TiN.

After the phase change material is deposited, including the heating material layers, barrier metal films may then be formed on and/or over the inner wall surfaces of the contact holes. A conductive material may then buried in the contact holes and on and/or over the barrier metal films. The barrier metal films may serve to prevent an attack due to a process gas used in deposition and also to improve an interlayer bonding strength. Finally, a metal electrode may then be formed at an upper portion of an exposed portion of the contact hole.

As described above, in accordance with embodiments, a phase change material may be deposited inside or outside the cell actually operated in the device to prevent a device defect and a device failure caused by heat. It is possible to detect a rapid increase in current due to heat using the phase change material and also possible to break the circuit in advance with the rapid increase in current. Since the phase change material is used in accordance with embodiments, it is easier to restore a circuit broken due to an increase in current. Since there is no need to ensure electro migration (EM) characteristics or stress migration (SM) characteristics through the quality inspection, it is easy to realize a device having good quality within a desired temperature range. It is also possible to reduce human and material resources consumed according to the quality inspection required to realize a semiconductor device having good quality.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
    forming a transistor on a wafer, the transistor including a gate and first and second source/drain regions formed on opposite sides of the gate; and then
    forming an insulating film on the transistor; and then
    forming a first contact hole and a second contact hole in the insulating film exposing the first source/drain region; and then
    forming a phase change material layer in the second contact hole; and then
    forming a first contact plug in the first contact hole, and forming a second contact plug in the second contact hole and over the phase change material layer, respectively, the first and second contact plugs being electrically connected to the first source/drain region,
    wherein the phase change material layer is adapted to selectively break the electrical connection between the first source/drain regions and the first contact plug in accordance with a detected variation in temperature.

2. The method according to claim 1, further comprising, after forming the first and second contact plugs:
    forming an upper electrode on the at least first and second contact plugs for electrical connection to the source/drain region.

3. The method of claim 1, further comprising,
    forming a lower heating material layer in the second contact hole on the first source/drain region before forming the phase change material layer; and
    forming an upper heating material layer on the phase change material layer.

4. The method of claim 3, wherein the upper and the lower heating material layers each comprise a nitride-based material.

5. The method of claim 4, wherein the nitride-based material comprises titanium nitride (TiN).

6. The method of claim 3, wherein the second contact plug is formed in the second contact hole and on the upper heating material layer.

7. The method of claim 1, further comprising,
    forming a lower heating material layer in the second contact hole on the first source/drain region before forming the phase change material layer.

8. The method of claim 7, wherein the lower heating material layers comprises a nitride-based material.

9. The method of claim 8, wherein the nitride-based material comprises titanium nitride (TiN).

10. The method of claim 7, wherein the second contact plug is formed in the second contact hole and on the phase change material layer.

11. The method of claim 1, further comprising,
    forming an upper heating material layer on the phase change material layer.

12. The method of claim 11, wherein the upper heating material layers comprises a nitride-based material.

13. The method of claim 11, wherein the nitride-based material comprises titanium nitride (TiN).

14. The method of claim 11, wherein the second contact plug is formed in the second contact hole and on the upper heating material layer.

15. The method according to claim 1, wherein forming the first and second contact plugs comprises:
    forming a barrier metal film on inner wall surfaces of the first contact hole and the second contact hole; and then
    burying a conductive material in the first contact hole and the second contact hole.

16. The method according to claim 1, wherein the phase change material layer comprises a compound including at least one of germanium (Ge), stibium (Sb) and tellurium (Te).

* * * * *